United States Patent [19]

Collins et al.

[11] Patent Number: 4,785,381

[45] Date of Patent: Nov. 15, 1988

[54] HOLDER FOR CLIP MOUNTING TELEPHONE CIRCUITS TO CONNECTING BLOCKS

[75] Inventors: Thomas J. Collins, Wall; Richard K. Laird, Lincroft; Pina Schneider, Ocean Township, Monmouth County, all of N.J.

[73] Assignee: Keptel, Inc., Tinton Falls, N.J.

[21] Appl. No.: 53,304

[22] Filed: May 22, 1987

[51] Int. Cl.⁴ .............................................. H05K 7/02
[52] U.S. Cl. .................................... 361/417; 361/419
[58] Field of Search ............... 361/346, 394, 395, 399, 361/417, 419–420, 426, 428; 379/19, 27, 29, 327–332, 387

[56] References Cited

U.S. PATENT DOCUMENTS 4,500,943 2/1985 Greene ................................. 361/383

Primary Examiner—A. D. Pellinen
Assistant Examiner—Gregory D. Thompson
Attorney, Agent, or Firm—R. Gale Rhodes, Jr.

[57] ABSTRACT

A holder for retaining telephone related circuitry enables telephone circuitry designed for various specific mounting configurations to be mounted to a connecting block. The holder includes a housing having an opening for receiving the circuit. Ear projections and a flexible hook-shaped projection are integrally molded in the interior portion of the housing for removably retaining the circuitry. The housing also has fanning strip guides integrally molded in its exterior portion for insertion between fanning strips on the connecting block. A first tab and a flexible second tab project off of and are integrally molded to the housing so that the housing can snap on to the connecting block.

5 Claims, 2 Drawing Sheets

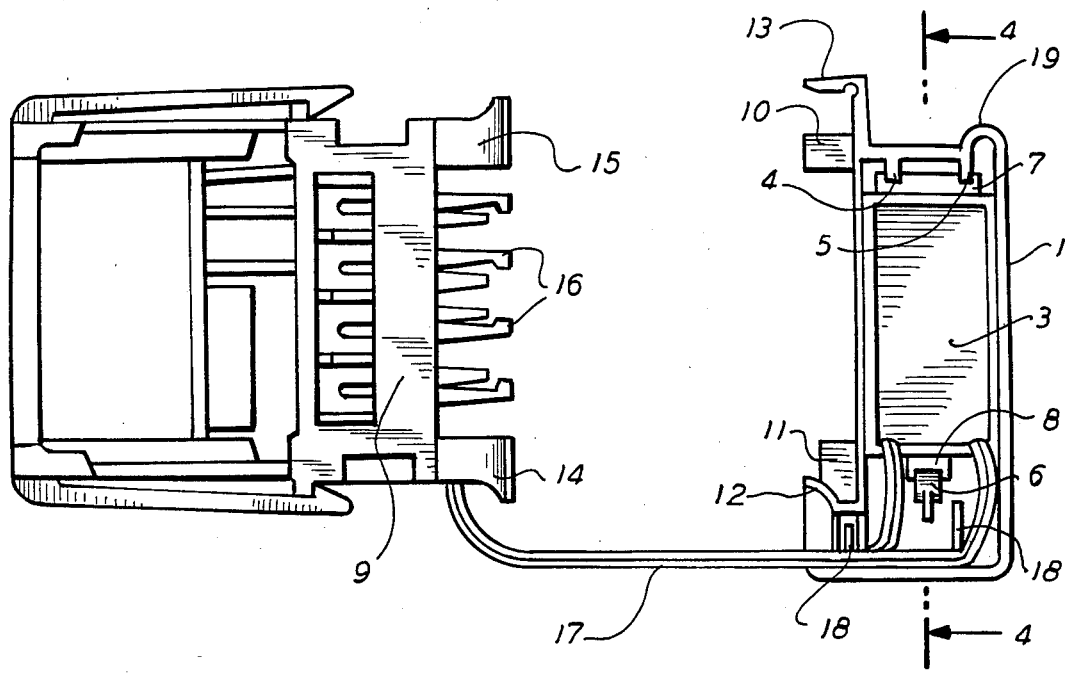
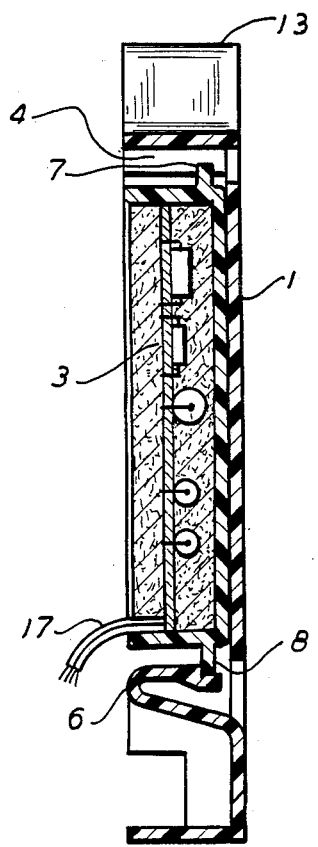
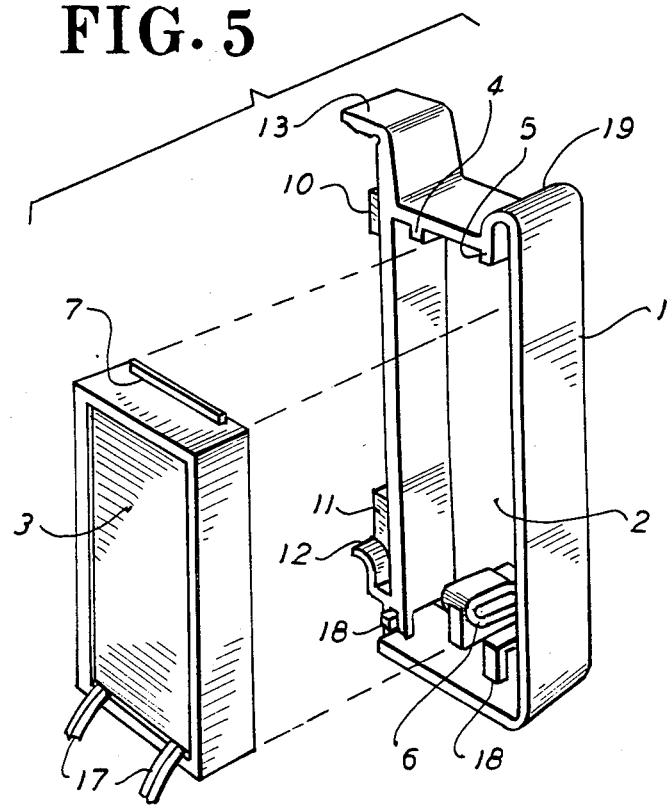

HOLDER FOR CLIP MOUNTING TELEPHONE CIRCUITS TO CONNECTING BLOCKS

BACKGROUND OF THE INVENTION

The present invention relates generally to telephone circuitry, and more specifically, it concerns a circuit housing or retainer that conveniently clips to connecting block terminals of incoming and outgoing telephone lines.

In recent years, the telephone industry has made great strides in reducing telephone equipment installation and maintenance costs. Thus, for example, modularized systems and circuits have been developed which cost effectively minimize field wiring and simplify installation and testing. In this regard, connecting blocks and maintenance termination units (MTUs) have been developed.

Various types of connecting blocks such as the "66 type block" for telephone wire circuits or pairs have been designed to offer increased flexibility of wiring arrangements and reduced costs (where fewer distribution terminals are needed). The development of MTUs have enabled telephone personnel to effectively and efficiently detect faults in telephone wiring from remote locations. As a further convenience with respect to these particular modularized circuits and systems, AT&T manufactures a MTU module specifically designed for attachment to a connecting block.

The AT&T MTU module is an integral unit and has no replacement parts. One disadvantage of a MTU module of this design is that it can only be utilized in connection with the "66 type" connecting blocks since the unit includes mounting devices which allow it to be mounted only to this particular connecting block. Thus, the AT&T MTU module cannot be used conveniently in conjunction with other types of connectors or in other types of enclosures, for example network interface enclosures of the type manufactured by KEPTEL, e.g. the SNI 2100 and 2200.

SUMMARY OF THE INVENTION

The present invention provides a convenient, efficient, and economical means for installing common circuits on connecting block terminals. The invention embodies a holder which allows common circuitry, including MTU's, to be installed on a connector block by inserting the circuit in the holder and thereafter snapping the holder to the connecting block. In this manner, common circuits with mounting configurations useful in other types of applications, e.g. in telephone network interface enclosures, can be mounted conveniently to connecting blocks.

Accordingly, the objects of the present invention are achieved by a holder adapted for attachment to a connecting block having multiple rows of terminals for terminating wires and fanning strips on each side of outer ones of the rows of terminals.

The holder includes a housing having an opening for receiving the circuitry. Ear projections and a flexible hook-shaped projection are integrally molded in the interior portion of the housing for removably retaining the circuitry. The housing also has fanning strip guides integrally molded in its interior portion for insertion between fanning strips on the connecting block. A first tab and a flexible second tab project off of and are integrally molded to the housing so that the housing can snap on to the connecting block.

BRIEF DESCRIPTION OF DRAWINGS

The invention will be described in greater detail in the following detailed description with reference to the drawings in which:

FIG. 3 is an end view of the circuit holder of the present invention detached from but electrically connected to a connecting block and having a circuit disposed therein.

FIG. 4 is a cross sectional view, taken along the line 4—4 in FIG. 3 in the direction of the arrows, of the circuit holder of the present invention with a circuit disposed therein.

FIG. 5 is a perspective view of the circuit holder of the present invention showing a circuit removed therefrom.

DETAILED DESCRIPTION OF THE DRAWINGS

Figure 1:
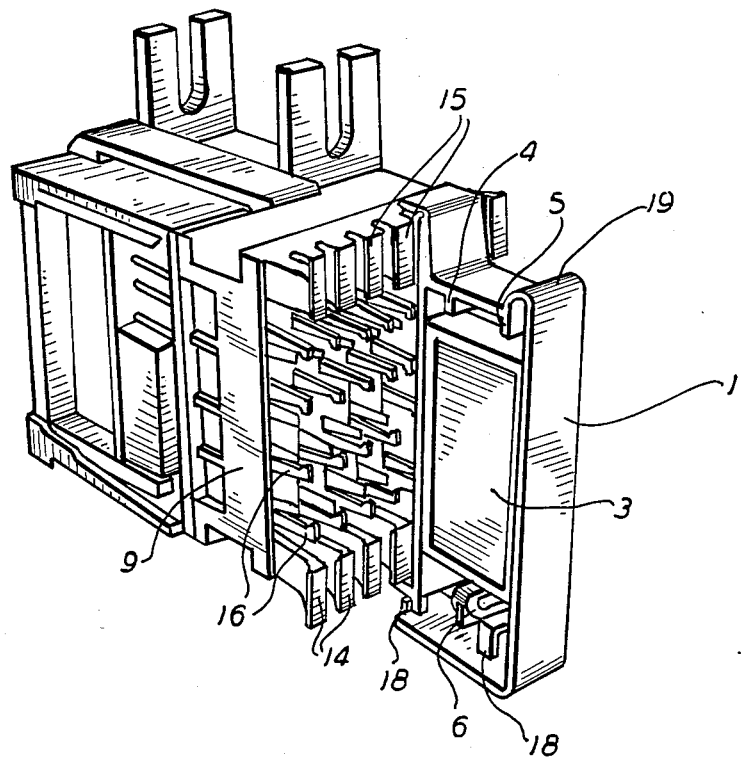
FIG. 1 is a perspective view of the circuit holder of the present invention clipped to a connecting block and having a circuit disposed therein.
Figure 2:
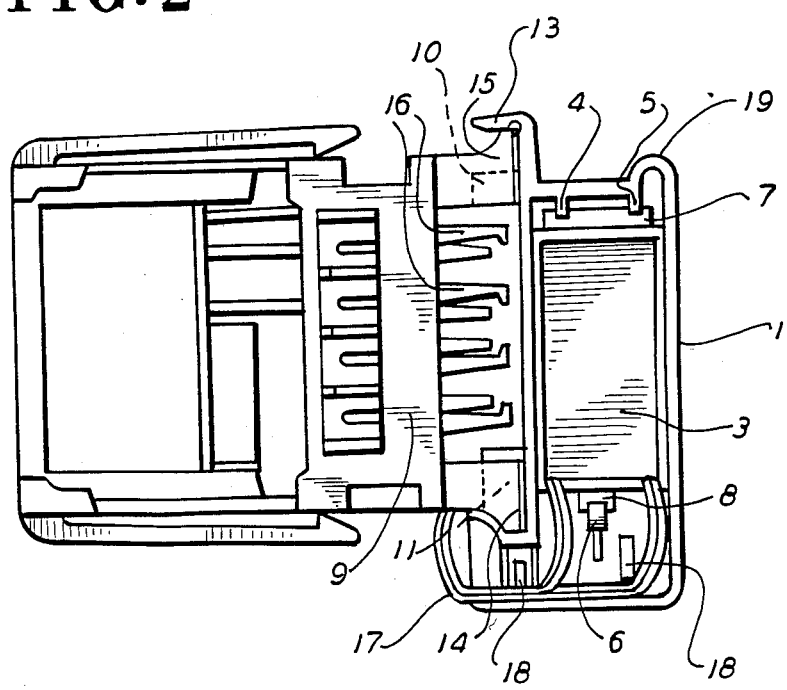
FIG. 2 is an end view of the circuit holder of the present invention clipped to a connecting block and having a circuit disposed therein.

With reference now to the drawings, the circuit holder of the present invention preferably includes a housing 1 having an opening 2 for receiving a telephonic circuit 3 as shown in FIGS. 1, 2 and 3 and illustrated in assembly in FIG. 5.

Housing 1 is preferably molded in self extinguishing plastic. Circuit 3 can be any telephonic circuit such as a MTU and can be a circuit that slides into other telephonic units such as network interface enclosures, e.g. the Keptel SN-2200. The circuit 3 is appropriately sized so as to slide into card holder guides in the network interface enclosure, as will be apparent to a person skilled in the telephone art.

In order to removably retain circuit 3 in housing 1, ears 4 and 5 and a flexible hook-shaped projection 6 are integrally molded in the interior portion of housing 1. Thus, as shown in FIG. 5, to insert circuit 3 in housing 1, tab 7 of circuit 3 slides under ears 4 and 5 of housing 1, and tab 8 of circuit 3 engages flexible hook-shaped projection 6 until flexible hook-shaped projection 6 snaps over and retains tab 8 of circuit 3 in housing 1 as shown in FIG. 4.

To attach the circuit holder of the present invention to connecting block 9, fanning strip guides 10 and 11 and a first tab 12 and a flexible second tab 13 are integrally molded in the exterior portion housing 1 as shown in FIG. 3. As may be best understood by reference to FIG. 2, fanning strip guides 10 and 11 slide in the spaces between fanning strips 14 and the corresponding spaces between fanning strips 15 of connecting block 9 when first tab 12 engages with fanning strip 14 of connecting block 9; flexible tab 13 then engages and snaps over fanning strips 15 on the side of connecting block 9 opposing fanning strips 14 which engage first tab 12. The circuit holder may also be attached in a reverse manner so that first tab 12 engages with fanning strip 15 and flexible tab 13 engages and snaps over fanning strip 14. To assist in removal of the circuit holder from fanning strips 14 and 15 of connecting block 9, lip 19 is integrally molded in housing 1.

Electrical wiring 17 from circuit 3 is routed through wire guides 18 (FIGS. 1, 2 and 5), which are integrally molded in housing 1, and can be connected to any of terminals 16 (FIG. 2) on connecting block 9.

Accordingly, the present invention provides a holder for a telephone circuit that allows common telephone circuits that are often used in other applications (e.g. in network interface enclosures) to be mounted conveniently also to a telephone connector block.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are accordingly to be regarded in an illustrative rather than a restrictive sense.

What is claimed is

1. A holder for retaining a circuit adapted for attachment to a connecting block, the connecting block having multiple rows of terminals for terminating wires and fanning strips on each side of outer ones of the rows of terminals, the holder comprising:

a housing having an opening for receiving the circuit; said housing having snap in mounting means integrally molded in the interior portion of said housing for removably retaining said circuit; said housing having guide means integrally molded in the exterior portion of said housing for engagement between the fanning strips of said connecting block; and said housing having a first tab projecting off of and integrally molded in the exterior portion of said housing for engagement with said fanning strips on one side of said connecting block, and a second tab projecting off of and integrally molded in the exterior portion of said housing for engagement with said fanning strips on the side of said connecting block opposite the side with the fanning strips which engage with said first tab, said first and second tabs provided for snap on engagement with said connecting block.

2. A holder as recited in claim 1 wherein said snap in mounting means comprises an ear projection on a first portion of the interior portion of said housing and a hook-shaped projection on another portion opposite said first portion.

3. A holder as recited in claim 1 wherein at least one of said first and second tabs is flexible.

4. A holder as recited in claim 1 wherein said holder further comprises means for guiding circuit wiring from said circuit through said housing to said connecting block terminals.

5. A holder as recited in claim 1 wherein said holder is molded from plastic.

* * * * *